(12) United States Patent
Kim

(10) Patent No.: US 10,699,759 B2
(45) Date of Patent: Jun. 30, 2020

(54) SEMICONDUCTOR DEVICES

(71) Applicant: SK hynix Inc., Icheon-si, Gyeonggi-do (KR)

(72) Inventor: Woongrae Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/453,602

(22) Filed: Jun. 26, 2019

(65) Prior Publication Data

US 2020/0160895 A1    May 21, 2020

(30) Foreign Application Priority Data

Nov. 15, 2018    (KR) .......................... 10-2018-0140757

(51) Int. Cl.
*G11C 7/10* (2006.01)
*G11C 7/22* (2006.01)

(52) U.S. Cl.
CPC .......... *G11C 7/1072* (2013.01); *G11C 7/1066* (2013.01); *G11C 7/1093* (2013.01); *G11C 7/222* (2013.01)

(58) Field of Classification Search
None
See application file for complete search history.

(56) References Cited

U.S. PATENT DOCUMENTS

| 6,711,090 | B2 | 3/2004 | Fujimori | |
| 2003/0147298 | A1* | 8/2003 | Ooishi | G11C 7/1045 365/233.1 |
| 2005/0138456 | A1* | 6/2005 | Song | G06F 1/06 713/400 |
| 2005/0243644 | A1* | 11/2005 | Taruishi | G11C 7/1066 365/189.05 |
| 2012/0120754 | A1* | 5/2012 | Fujisawa | G11C 11/4076 365/233.1 |
| 2020/0066325 | A1* | 2/2020 | Kang | G11C 11/4096 |

FOREIGN PATENT DOCUMENTS

KR    100703976 B1    4/2007

* cited by examiner

*Primary Examiner* — Tan T. Nguyen
(74) *Attorney, Agent, or Firm* — William Park & Associates Ltd.

(57) ABSTRACT

A semiconductor device includes a delay circuit, a read control circuit, and a register control circuit. The delay circuit generates a read control signal by delaying a column control pulse and an internal column control pulse including pulses sequentially generated based on an operation mode signal during a read operation and generates a register control signal by delaying the column control pulse including a pulse generated based on a mode register enablement signal during a mode register read operation. The read control circuit generates an input/output (I/O) control signal from a bank address signal when the read control signal is enabled. The register control circuit outputs a mode information signal as a mode output information signal when the register control signal is enabled.

20 Claims, 13 Drawing Sheets

SEMICONDUCTOR DEVICES

CROSS-REFERENCE TO RELATED APPLICATIONS

The present application claims priority under 35 U.S.C. 119(a) to Korean Application No. 10-2018-0140757, filed on Nov. 15, 2018, which is incorporated herein by reference in its entirety.

BACKGROUND

1. Technical Field

Embodiments of the present disclosure generally relate to semiconductor devices performing a read operation and a mode register read operation.

2. Related Art

In general, each of semiconductor devices such as dynamic random access memory (DRAM) devices may include a plurality of bank groups comprised of cell arrays which are selected by addresses. Each of the bank groups may be realized to include a plurality of banks. The semiconductor device may select any one of the plurality of bank groups and may perform a column operation for outputting data stored in a cell array included in the selected bank group through input/output (I/O) lines. In addition, the semiconductor device may include a mode register storing operational information and internal information and may perform a mode register read operation to output the information stored in the mode register.

SUMMARY

According to an embodiment, a semiconductor device includes a delay circuit, a read control circuit, and a register control circuit. The delay circuit generates a read control signal by delaying a column control pulse and an internal column control pulse including pulses sequentially generated based on an operation mode signal during a read operation and generates a register control signal by delaying the column control pulse including a pulse generated based on a mode register enablement signal during a mode register read operation. The read control circuit generates an input/output (I/O) control signal from a bank address signal when the read control signal is enabled. The register control circuit outputs a mode information signal as a mode output information signal when the register control signal is enabled.

According to an embodiment, a semiconductor device includes a delay circuit configured to generate first to fourth read control signals by delaying a column control pulse and an internal column control pulse during a read operation and configured to generate first to fourth register control signals by delaying the column control pulse during a mode register read operation, a read control circuit configured to be synchronized with the first to fourth read control signals to generate first to fourth input/output (I/O) control signals from first and second bank address signals, and a register control circuit configured to be synchronized with the first to fourth register control signals to output a mode information signal as a mode output information signal.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Semiconductor devices may provide a bank group mode, an 8 bank mode and a 16 bank mode. A bank group may include a plurality of banks. For example, the bank group may include four banks. In the bank group mode, a column operation for one bank included in the bank group may be performed by one command. In the 8 bank mode, column operations for two banks respectively included in two separate bank groups are sequentially performed by one command. In the 16 bank mode, column operations for four banks respectively included in four separate bank groups are sequentially performed by one command.

Figure 1:
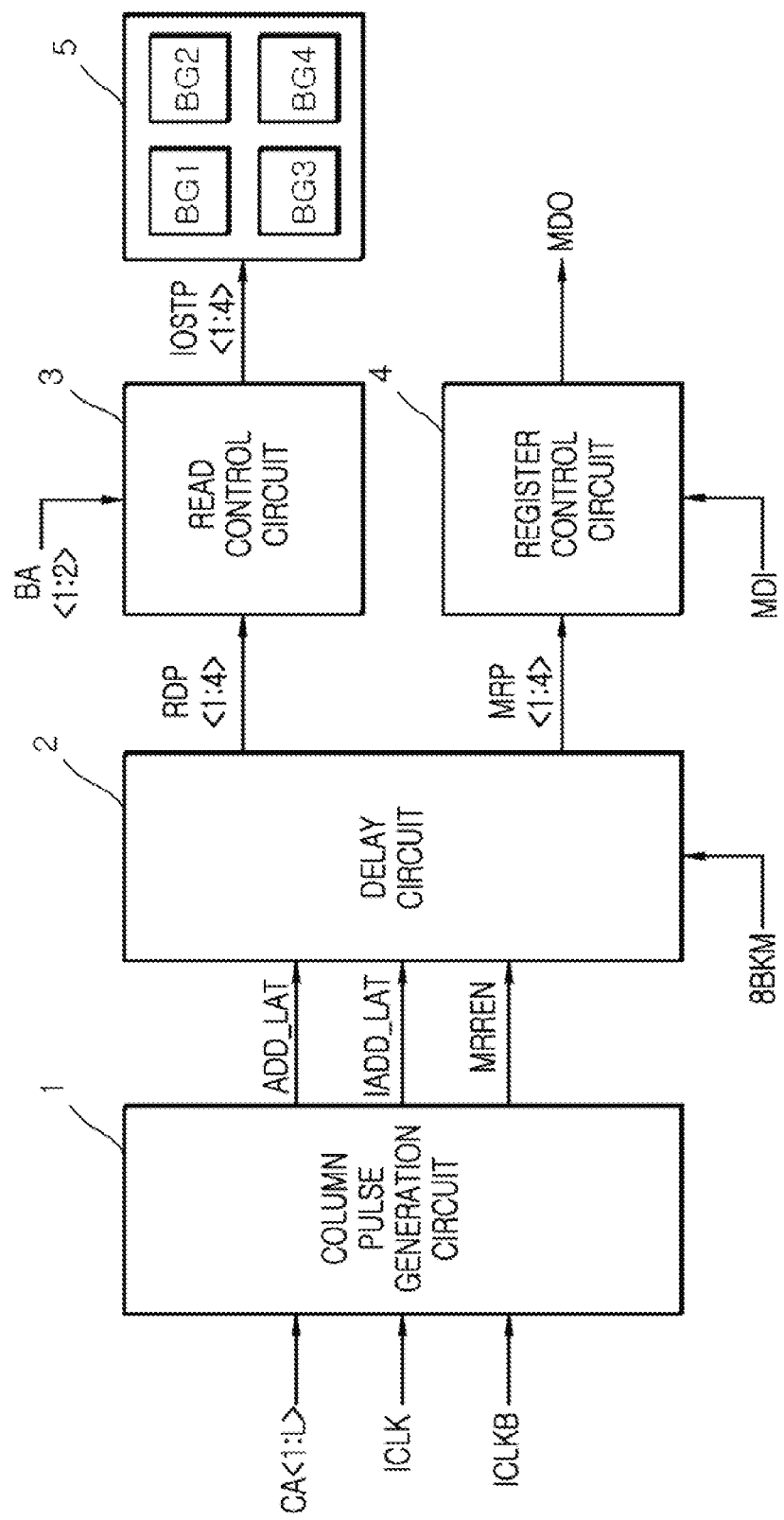
FIG. 1 is a block diagram illustrating a configuration of a semiconductor device according to an embodiment of the present disclosure.

As illustrated in FIG. 1, a semiconductor device according to an embodiment may include a column pulse generation circuit 1, a delay circuit 2, a read control circuit 3, a register control circuit 4, and a core region 5.

The column pulse generation circuit 1 may be synchronized with an internal clock signal ICLK and an inverted internal clock signal ICLKB to generate a column control pulse ADD_LAT and an internal column control pulse IADD_LAT which are sequentially generated when a command/address signal CA<1:L> has a logic level combination for a read operation. The column pulse generation circuit 1 may be synchronized with the internal clock signal ICLK and the inverted internal clock signal ICLKB to generate the column control pulse ADD_LAT when the command/address signal CA<1:L> has a logic level combination for a mode register read operation. The column pulse generation circuit 1 may be synchronized with the internal clock signal ICLK and the inverted internal clock signal ICLKB to generate a mode register enablement signal MRREN which is enabled when the command/address signal CA<1:L> has a logic level combination for the mode register read operation. The command/address signal CA<1:L> may be a signal provided by an external device (not shown) and may include a command and an address. The internal clock signal ICLK may toggle in synchronization with rising edges of a clock signal (not shown) provided by the external device. The inverted internal clock signal ICLKB may toggle in synchronization with falling edges of the clock signal provided by the external device. The number "L" of bits included in the command/address signal CA<1:L> may be set to be different according to the embodiments.

The delay circuit 2 may delay the column control pulse ADD_LAT and the internal column control pulse IADD_LAT to generate first to fourth read control signals RDP<1:4> which are sequentially enabled when an operation mode signal 8BKM is inputted during the read operation. Each of the first to fourth read control signals RDP<1:4> may include a first pulse generated from the column control pulse ADD_LAT and a second pulse generated from the internal column control pulse IADD_LAT. The delay circuit 2 may delay the column control pulse ADD_LAT to generate first to fourth register control signals MRP<1:4> which are sequentially enabled when the mode register enablement signal MRREN is enabled during a mode register operation. Each of the first to fourth register control signals MRP<1:4> may include a first pulse which is generated from the column control pulse ADD_LAT. The operation mode signal 8BKM may be set as a signal that is provided by the external device to enter the 8 bank mode in which two banks of first to fourth bank groups BG1~BG4 included in the core region 5 are activated to perform the read operation.

The read control circuit 3 may be synchronized with the first to fourth read control signals RDP<1:4> to generate first to fourth input/output (I/O) control signals IOSTP<1:4> from first and second bank address signals BA<1:2>. The read control circuit 3 may delay the first and second bank address signals BA<1:2> in synchronization with the first to third read control signals RDP<1:3> to generate first and second internal address signals (IAD<1:2> of FIG. 8). The read control circuit 3 may be synchronized with the fourth read control signal RDP<4> to generate the I/O control signals IOSTP<1:4> from the first and second internal address signals (IAD<1:2> of FIG. 8).

The register control circuit 4 may be synchronized with the first to fourth register control signals MRP<1:4> to output a mode information signal MDI as a mode output information signal MDO. The register control circuit 4 may delay the mode information signal MDI in synchronization with the first to third register control signals MRP<1:3> to generate an internal mode information signal (IMD of FIG. 9). The register control circuit 4 may be synchronized with the fourth register control signal MRP<4> to generate the mode output information signal MDO from the internal mode information signal (IMD of FIG. 9). The mode information signal MDI may include operational information on the semiconductor device and may be set as a signal which is generated from a mode register set (MRS).

The core region 5 may include the first to fourth bank groups BG1, BG2, BG3, and BG4.

The first bank group BG1 may be activated to perform the read operation when the first I/O control signal IOSTP<1> is enabled. Although the first bank group BG1 is realized to be activated to perform the read operation when the first I/O control signal IOSTP<1> is enabled, the first bank group BG1 may be realized to be activated to perform a write operation when the first I/O control signal IOSTP<1> is enabled according to the embodiments.

The second bank group BG2 may be activated to perform the read operation when the second I/O control signal IOSTP<2> is enabled. Although the second bank group BG2 is realized to be activated to perform the read operation when the second I/O control signal IOSTP<2> is enabled, the second bank group BG2 may be realized to be activated to perform the write operation when the second I/O control signal IOSTP<2> is enabled according to the embodiments.

The third bank group BG3 may be activated to perform the read operation when the third I/O control signal IOSTP<3> is enabled. Although the third bank group BG3 is realized to be activated to perform the read operation when the third I/O control signal IOSTP<3> is enabled, the third bank group BG3 may be realized to be activated to perform the write operation when the third I/O control signal IOSTP<3> is enabled according to the embodiments.

The fourth bank group BG4 may be activated to perform the read operation when the fourth I/O control signal IOSTP<4> is enabled. Although the fourth bank group BG4 is realized to be activated to perform the read operation when the fourth I/O control signal IOSTP<4> is enabled, the fourth bank group BG4 may be realized to be activated to perform the write operation when the fourth I/O control signal IOSTP<4> is enabled according to the embodiments. A configuration and an operation of the core region 5 will be described below with reference to FIG. 10 later.

Figure 2:
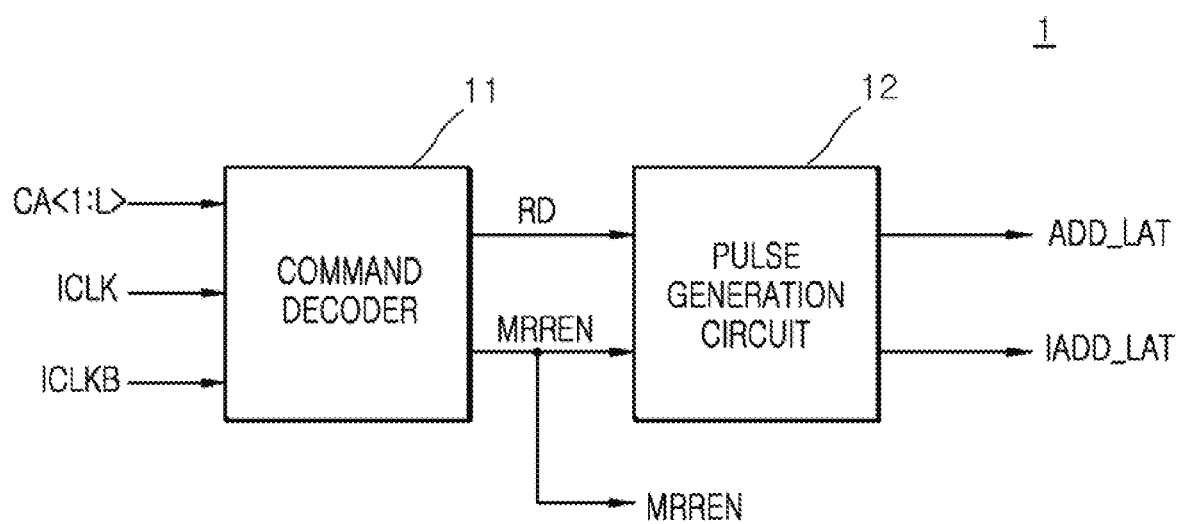
FIG. 2 is a block diagram illustrating a configuration of a column pulse generation circuit included in the semiconductor device of FIG. 1.

Referring to FIG. 2, the column pulse generation circuit 1 may include a command decoder 11 and a pulse generation circuit 12.

The command decoder 11 may decode the command/address signal CA<1:L> in synchronization with the internal clock signal ICLK and the inverted internal clock signal ICLKB to generate a read signal RD and the mode register enablement signal MRREN. The command decoder 11 may be synchronized with the internal clock signal ICLK and the inverted internal clock signal ICLKB to generate the read signal RD which is enabled when the command/address signal CA<1:L> has a logic level combination for performing the read operation. The command decoder 11 may be synchronized with the internal clock signal ICLK and the inverted internal clock signal ICLKB to generate the mode register enablement signal MRREN which is enabled when the command/address signal CA<1:L> has a logic level combination for performing the mode register read operation.

The pulse generation circuit 12 may generate the column control pulse ADD_LAT and the internal column control pulse IADD_LAT including pulses which are sequentially generated when the read signal RD is enabled. The pulse generation circuit 12 may generate the column control pulse ADD_LAT including a pulse which is generated when the read signal RD is enabled. The pulse generation circuit 12 may shift the column control pulse ADD_LAT by a predetermined period to generate the internal column control pulse IADD_LAT. The predetermined period by which the column control pulse ADD_LAT is shifted may be a period which is set to perform the column operation based on a burst length. The predetermined period by which the column control pulse ADD_LAT is shifted may be set to be different according to the embodiments. The pulse generation circuit 12 may generate the column control pulse ADD_LAT including a pulse which is generated when the mode register enablement signal MRREN is enabled. The word "predetermined" as used herein with respect to a parameter, such as a predetermined period, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Figure 3:
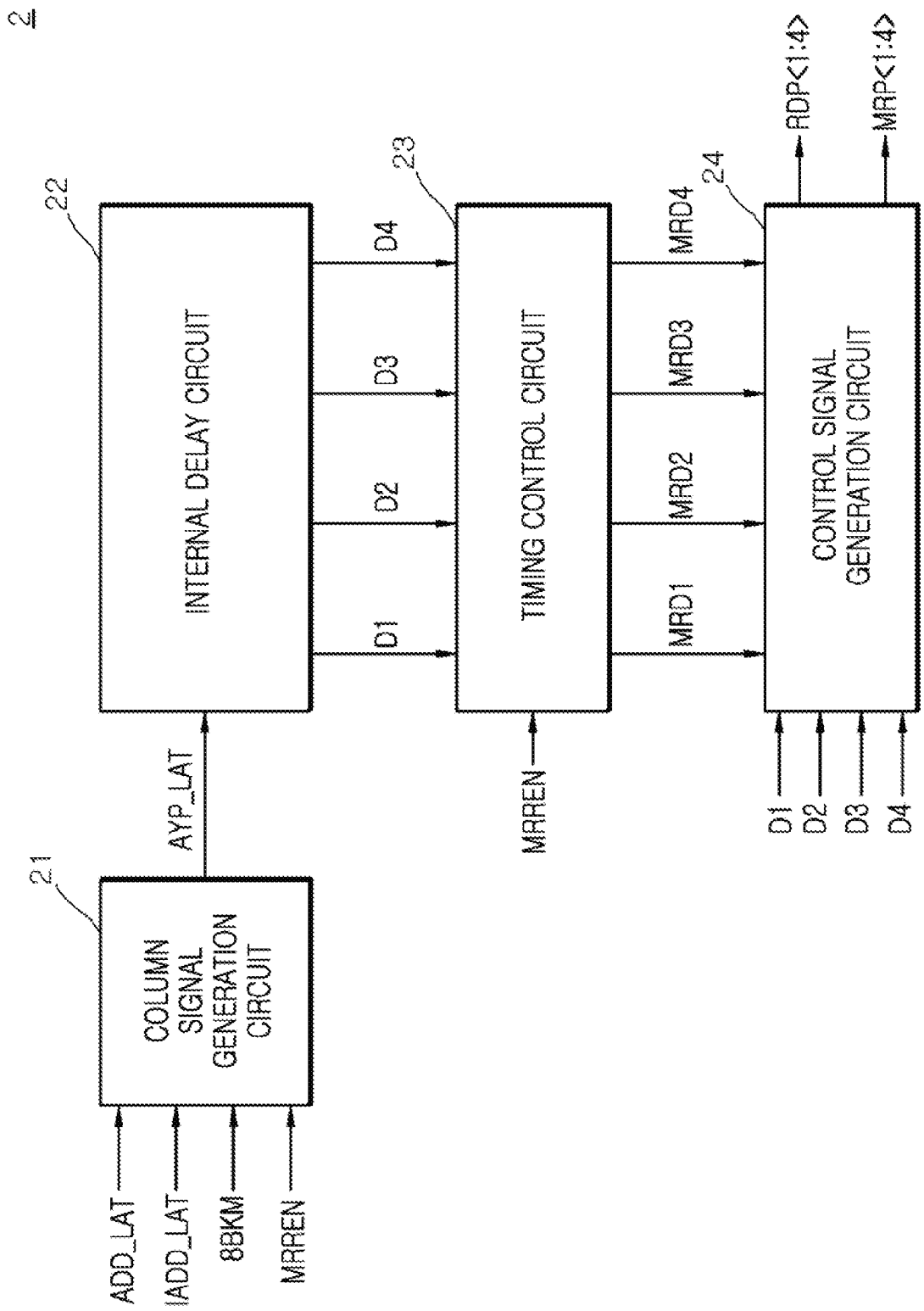
FIG. 3 is a block diagram illustrating a configuration of a delay circuit included in the semiconductor device of FIG. 1.

Referring to FIG. 3, the delay circuit 2 may include a column signal generation circuit 21, an internal delay circuit 22, a timing control circuit 23, and a control signal generation circuit 24.

The column signal generation circuit 21 may generate a column signal AYP_LAT according to the column control pulse ADD_LAT and the internal column control pulse IADD_LAT when any one of the operation mode signal 8BKM and the mode register enablement signal MRREN is enabled. The column signal generation circuit 21 may generate the column signal AYP_LAT from the column control pulse ADD_LAT and the internal column control pulse IADD_LAT when the operation mode signal 8BKM is enabled. The column signal generation circuit 21 may generate the column signal AYP_LAT from the column control pulse ADD_LAT when the mode register enablement signal MRREN is enabled.

The internal delay circuit 22 may delay the column signal AYP_LAT to generate first to fourth delay signals D1~D4 which are sequentially enabled. The internal delay circuit 22 may delay the column signal AYP_LAT to generate the first delay signal D1. The internal delay circuit 22 may delay the first delay signal D1 to generate the second delay signal D2. The internal delay circuit 22 may delay the second delay signal D2 to generate the third delay signal D3. The internal delay circuit 22 may delay the third delay signal D3 to generate the fourth delay signal D4.

The timing control circuit 23 may delay the mode register enablement signal MRREN according to the first to fourth delay signals D1~D4 to generate first to fourth register delay signals MRD1~MRD4 which are sequentially enabled. The timing control circuit 23 may delay the mode register enablement signal MRREN in synchronization with the first delay signal D1 to generate the first register delay signal MRD1. The timing control circuit 23 may delay the first register delay signal MRD1 in synchronization with the second delay signal D2 to generate the second register delay signal MRD2. The timing control circuit 23 may delay the second register delay signal MRD2 in synchronization with the third delay signal D3 to generate the third register delay signal MRD3. The timing control circuit 23 may delay the third register delay signal MRD3 in synchronization with the fourth delay signal D4 to generate the fourth register delay signal MRD4.

The control signal generation circuit 24 may generate the first to fourth read control signals RDP<1:4> from the first to fourth delay signals D1~D4 according to logic levels of the first to fourth register delay signals MRD1~MRD4. The control signal generation circuit 24 may generate the first to fourth register control signals MRP<1:4> from the first to fourth delay signals D1~D4 according to logic levels of the first to fourth register delay signals MRD1~MRD4.

Figure 4:
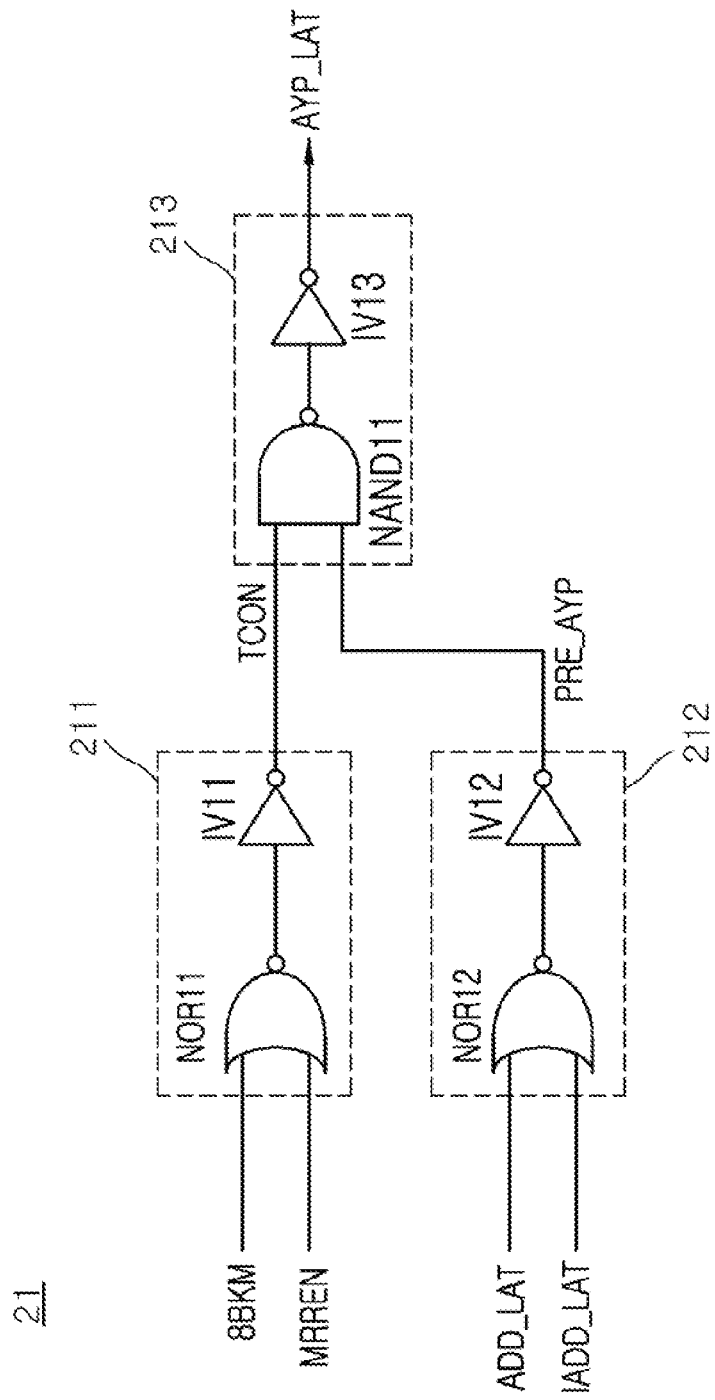
FIG. 4 is a circuit diagram illustrating a configuration of a column signal generation circuit included in the delay circuit of FIG. 3.

Referring to FIG. 4, the column signal generation circuit 21 may include a first logic circuit 211, a second logic circuit 212, and a third logic circuit 213.

The first logic circuit 211 may be configured to perform OR and inversion operation and may include, for example but not limited to, a NOR gate NOR11 and an inverter IV11. The first logic circuit 211 may generate a transmission control signal TCON which is enabled to have a logic "high" level when any one of the operation mode signal 8BKM and the mode register enablement signal MRREN is enabled to have a logic "high" level. The first logic circuit 211 may perform a logical OR operation of the operation mode signal 8BKM and the mode register enablement signal MRREN to generate the transmission control signal TCON. As used herein, a signal, such as the transmission control signal TCON or a mode register enablement signal MRREN, etc., having a low level distinguishes from the signal when it has a high level. For example, the high level may correspond to the signal having a first voltage, and the low level may correspond to the signal having a second voltage. For some embodiments, the first voltage is greater than the second voltage. In other embodiments, different characteristics of a signal, such as frequency or amplitude, determine whether the signal has a high level or a low level. For some cases, the high and low levels of a signal represent logical binary states.

The second logic circuit 212 may be configured to perform an OR operation and an inversion operation and may include, for example but not limited to, a NOR gate NOR12 and an inverter IV12. The second logic circuit 212 may generate a pre-column signal PRE-AYP which is enabled to have a logic "high" level when any one of the column control pulse ADD_LAT and the internal column control pulse IADD_LAT is enabled to have a logic "high" level. The second logic circuit 212 may perform a logical OR operation of the column control pulse ADD_LAT and the internal column control pulse IADD_LAT to generate the pre-column signal PRE-AYP.

The third logic circuit 213 may be configured to perform AND and inversion operations and may include, for example but not limited to, a NAND gate NAND11 and an inverter IV13. The third logic circuit 213 may buffer the pre-column signal PRE-AYP to generate the column signal AYP_LAT when the transmission control signal TCON is enabled to have a logic "high" level. The third logic circuit 213 may perform a logical AND operation of the transmission control signal TCON and the pre-column signal PRE-AYP to generate the column signal AYP_LAT.

Figure 5:
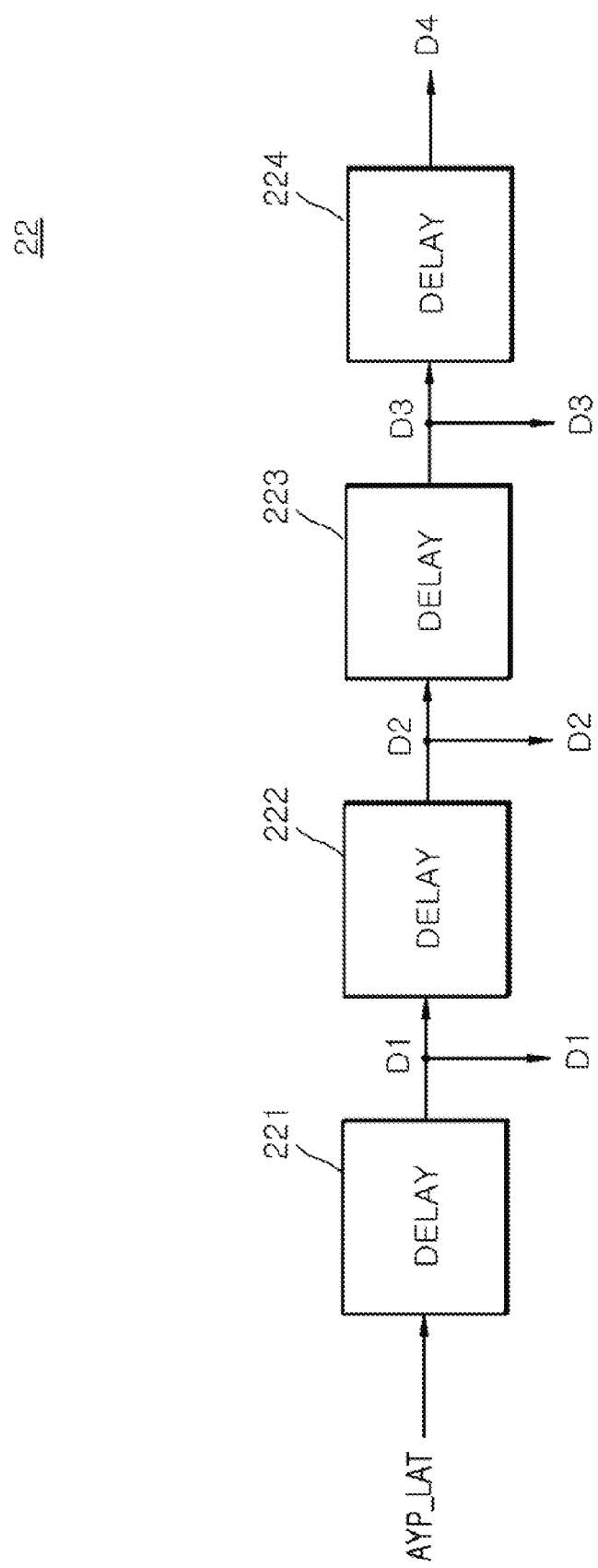
FIG. 5 is a block diagram illustrating a configuration of an internal delay circuit included in the delay circuit of FIG. 3.

Referring to FIG. 5, the internal delay circuit 22 may include a first unit delay circuit 221, a second unit delay circuit 222, a third unit delay circuit 223, and a fourth unit delay circuit 224.

The first unit delay circuit 221 may delay the column signal AYP_LAT to generate the first delay signal D1.

The second unit delay circuit 222 may delay the first delay signal D1 to generate the second delay signal D2.

The third unit delay circuit 223 may delay the second delay signal D2 to generate the third delay signal D3.

The fourth unit delay circuit 224 may delay the third delay signal D3 to generate the fourth delay signal D4.

Each of the first unit delay circuit 221, the second unit delay circuit 222, the third unit delay circuit 223, and the fourth unit delay circuit 224 may be realized using an inverter chain or an R-C delay circuit such that the first to fourth unit delay circuits 221, 222, 223, and 224 have the same delay time.

Figure 6:
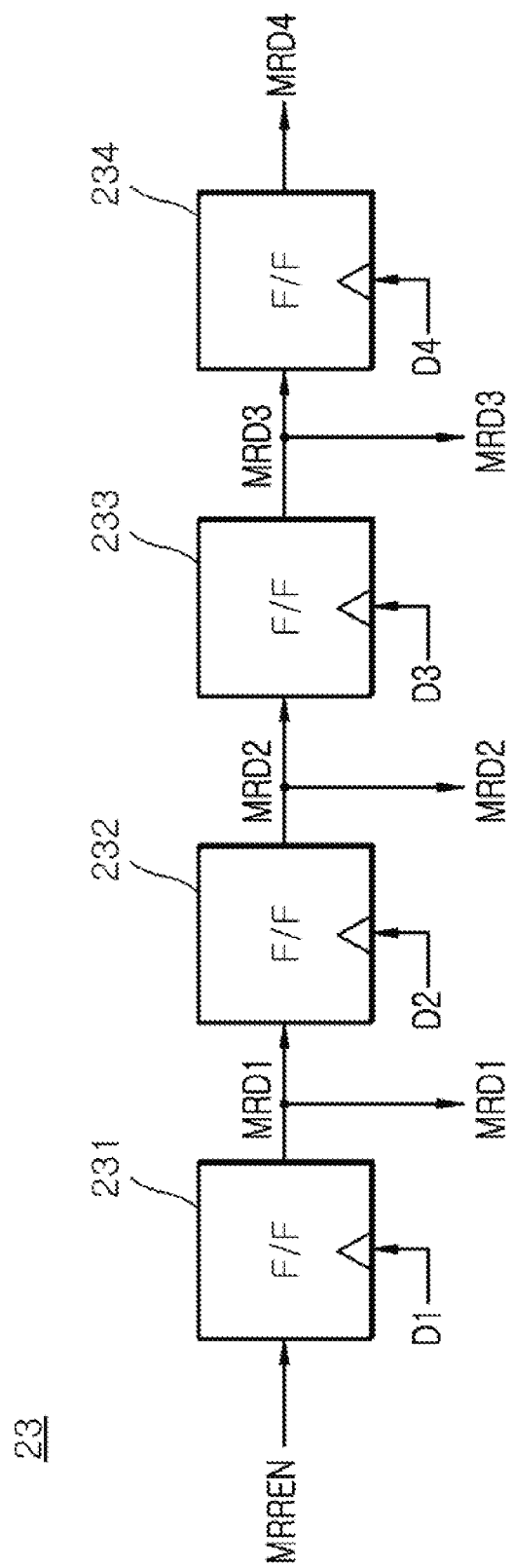
FIG. 6 is a block diagram illustrating a configuration of a timing control circuit included in the delay circuit of FIG. 3.

Referring to FIG. 6, the timing control circuit 23 may include a first latch circuit 231, a second latch circuit 232, a third latch circuit 233, and a fourth latch circuit 234.

The first latch circuit 231 may be realized using a flip-flop. The first latch circuit 231 may latch the mode register enablement signal MRREN in synchronization with the first delay signal D1 to generate the first register delay signal MRD1.

The second latch circuit 232 may be realized using a flip-flop. The second latch circuit 232 may latch the first register delay signal MRD1 in synchronization with the second delay signal D2 to generate the second register delay signal MRD2.

The third latch circuit 233 may be realized using a flip-flop. The third latch circuit 233 may latch the second register delay signal MRD2 in synchronization with the third delay signal D3 to generate the third register delay signal MRD3.

The fourth latch circuit 234 may be realized using a flip-flop. The fourth latch circuit 234 may latch the third register delay signal MRD3 in synchronization with the fourth delay signal D4 to generate the fourth register delay signal MRD4.

Figure 7:
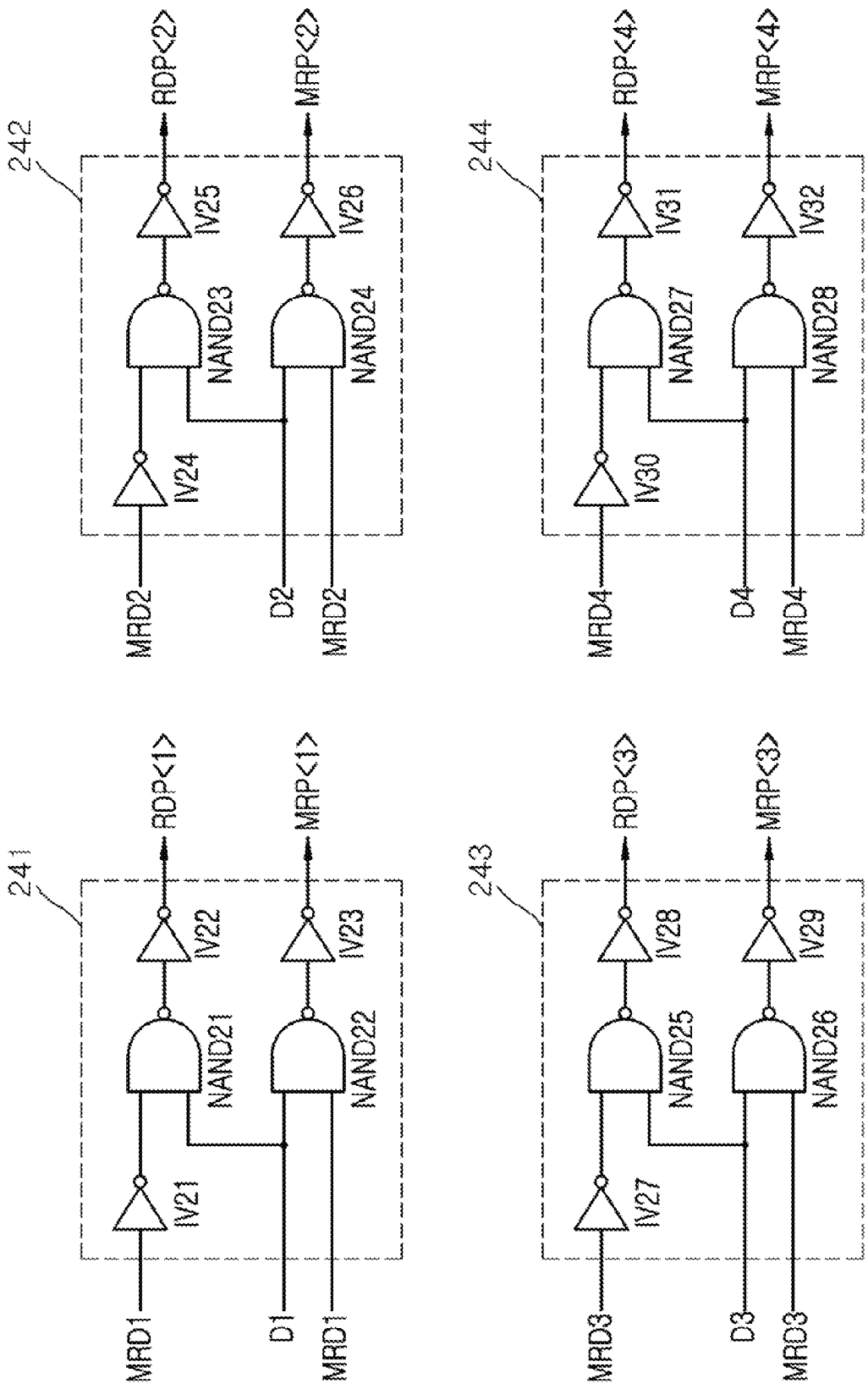
FIG. 7 is a circuit diagram illustrating a configuration of a control signal generation circuit included in the delay circuit of FIG. 3.

Referring to FIG. 7, the control signal generation circuit 24 may include a first control signal generation circuit 241, a second control signal generation circuit 242, a third control signal generation circuit 243, and a fourth control signal generation circuit 244.

The first control signal generation circuit 241 may be configured to perform AND and inversion operations and may include, for example but not limited to, inverters IV21, IV22, and IV23 and NAND gates NAND21 and NAND22. The first control signal generation circuit 241 may buffer the first delay signal D1 to generate the first read control signal RDP<1> when the first register delay signal MRD1 is disabled to have a logic "low" level. The first control signal generation circuit 241 may buffer the first delay signal D1 to generate the first register control signal MRP<1> when the first register delay signal MRD1 is enabled to have a logic "high" level.

The second control signal generation circuit 242 may be configured to perform AND and inversion operations and may include, for example but not limited to, inverters IV24, IV25, and IV26 and NAND gates NAND23 and NAND24. The second control signal generation circuit 242 may buffer the second delay signal D2 to generate the second read control signal RDP<2> when the second register delay signal MRD2 is disabled to have a logic "low" level. The second control signal generation circuit 242 may buffer the second delay signal D2 to generate the second register control signal MRP<2> when the second register delay signal MRD2 is enabled to have a logic "high" level.

The third control signal generation circuit 243 may be configured to perform AND and inversion operations and may include, for example but not limited to, inverters IV27, IV28, and IV29 and NAND gates NAND25 and NAND26. The third control signal generation circuit 243 may buffer the third delay signal D3 to generate the third read control signal RDP<3> when the third register delay signal MRD3 is disabled to have a logic "low" level. The third control signal generation circuit 243 may buffer the third delay signal D3 to generate the third register control signal MRP<3> when the third register delay signal MRD3 is enabled to have a logic "high" level.

The fourth control signal generation circuit 244 may be configured to perform AND and inversion operations and may include, for example but not limited to, inverters IV30, IV31, and IV32 and NAND gates NAND27 and NAND28. The fourth control signal generation circuit 244 may buffer the fourth delay signal D4 to generate the fourth read control signal RDP<4> when the fourth register delay signal MRD4 is disabled to have a logic "low" level. The fourth control signal generation circuit 244 may buffer the fourth delay signal D4 to generate the fourth register control signal MRP<4> when the fourth register delay signal MRD4 is enabled to have a logic "high" level.

Figure 8:
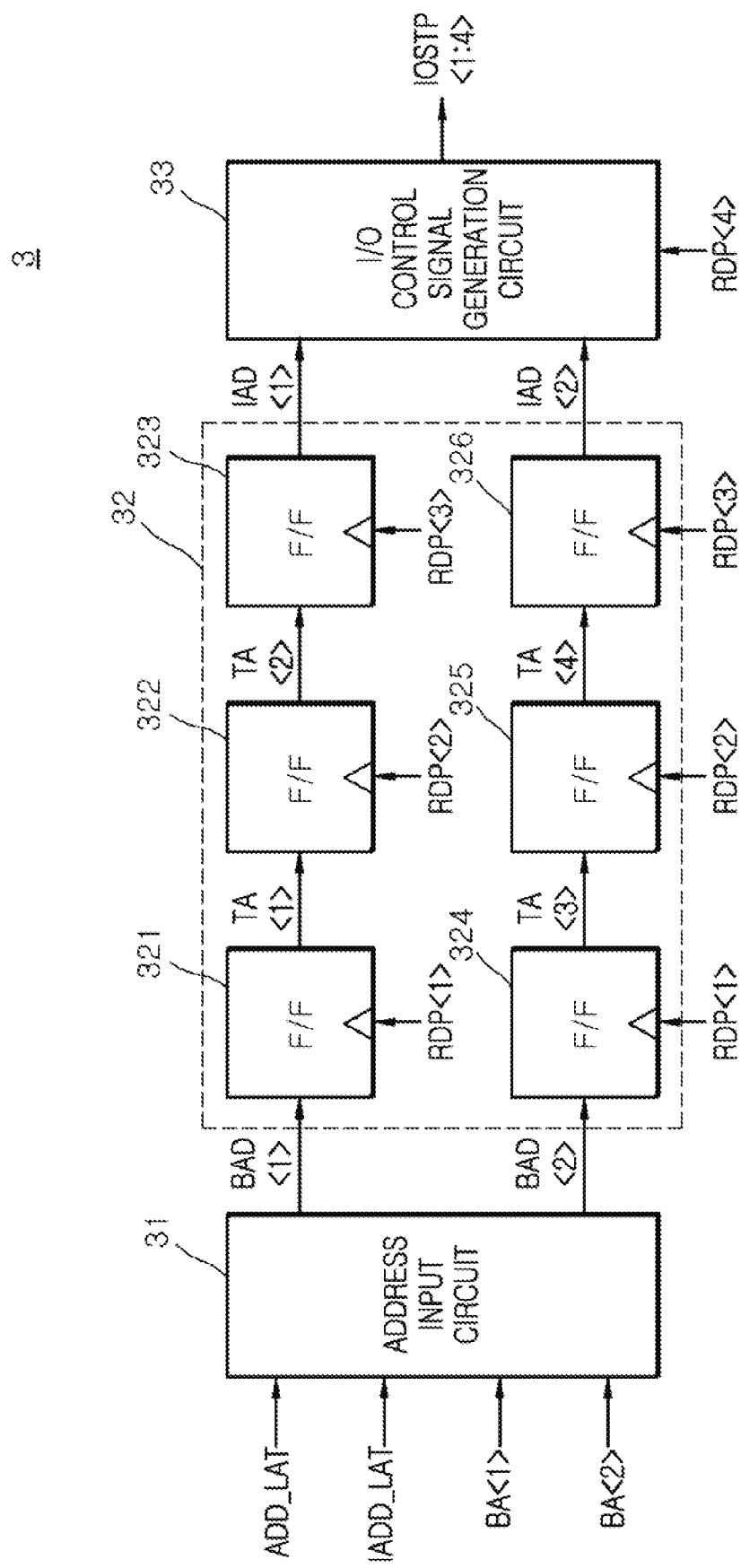
FIG. 8 is a block diagram illustrating a configuration of a read control circuit included in the semiconductor device of FIG. 1.

Referring to FIG. 8, the read control circuit 3 may include an address input circuit 31, an internal address generation circuit 32, and an I/O control signal generation circuit 33.

The address input circuit 31 may receive the first and second bank address signals BA<1:2> to generate first and second input bank address signals BAD<1:2> when the column control pulse ADD_LAT and the internal column control pulse IADD_LAT are enabled. The address input circuit 31 may receive the first and second bank address signals BA<1:2> to generate first and second input bank address signals BAD<1:2> when the column control pulse ADD_LAT is enabled to have a logic "high" level. The address input circuit 31 may receive the first and second bank address signals BA<1:2> to generate first and second input bank address signals BAD<1:2> when the internal column control pulse IADD_LAT is enabled to have a logic "high" level. In an embodiment, an address input circuit 31 may be configured to receive first and second bank address signals BA<1:2> to generate first and second input bank address signals BAD<1:2> when at least one of the column control pulse ADD_LAT and the internal column control pulse IADD_LAT is enabled.

The internal address generation circuit 32 may include a first flip-flop 321, a second flip-flop 322, a third flip-flop 323, a fourth flip-flop 324, a fifth flip-flop 325, and a sixth flip-flop 326.

The first flip-flop 321 may latch the first input bank address signal BAD<1> in synchronization with the first read control signal RDP<1> to generate a first transmission address signal TA<1>.

The second flip-flop 322 may latch the first transmission address signal TA<1> in synchronization with the second read control signal RDP<2> to generate a second transmission address signal TA<2>.

The third flip-flop 323 may latch the second transmission address signal TA<2> in synchronization with the third read control signal RDP<3> to generate the first internal address signal IAD<1>.

The fourth flip-flop 324 may latch the second input bank address signal BAD<2> in synchronization with the first read control signal RDP<1> to generate a third transmission address signal TA<3>.

The fifth flip-flop 325 may latch the third transmission address signal TA<3> in synchronization with the second read control signal RDP<2> to generate a fourth transmission address signal TA<4>.

The sixth flip-flop 326 may latch the fourth transmission address signal TA<4> in synchronization with the third read control signal RDP<3> to generate the second internal address signal IAD<2>.

The I/O control signal generation circuit 33 may be synchronized with the fourth read control signal RDP<4> to generate the first to fourth I/O control signals IOSTP<1:4> from the first and second internal address signals IAD<1:2>.

Figure 9:
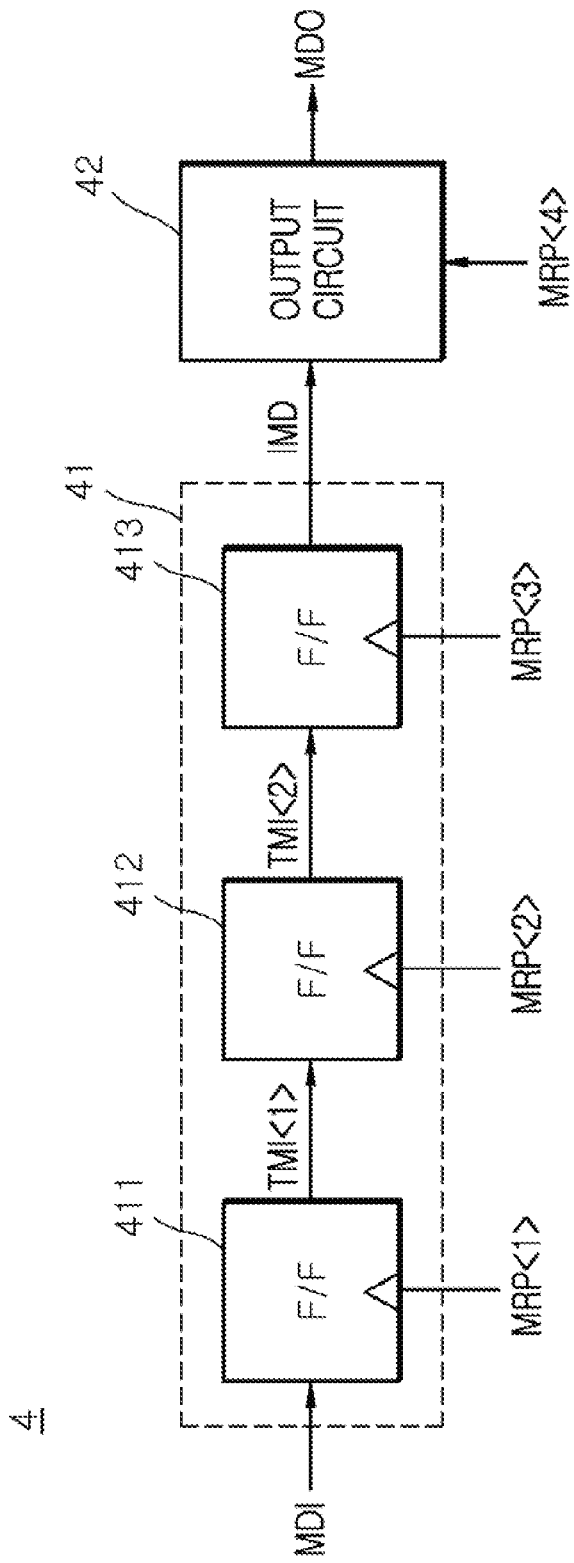
FIG. 9 is a block diagram illustrating a configuration of a register control circuit included in the semiconductor device of FIG. 1.

Referring to FIG. 9, the register control circuit 4 may include an internal mode information signal generation circuit 41 and an output circuit 42.

The internal mode information signal generation circuit 41 may include a seventh flip-flop 411, an eighth flip-flop 412, and a ninth flip-flop 413.

The seventh flip-flop 411 may latch the mode information signal MDI in synchronization with the first register control signal MRP<1> to generate a first transmission mode information signal TMI<1>.

The eighth flip-flop 412 may latch the first transmission mode information signal TMI<1> in synchronization with the second register control signal MRP<2> to generate a second transmission mode information signal TMI<2>.

The ninth flip-flop 413 may latch the second transmission mode information signal TMI<2> in synchronization with the third register control signal MRP<3> to generate the internal mode information signal IMD.

The output circuit 42 may be synchronized with the fourth register control signal MRP<4> to output the internal mode information signal IMD as the mode output information signal MDO.

Figure 10:
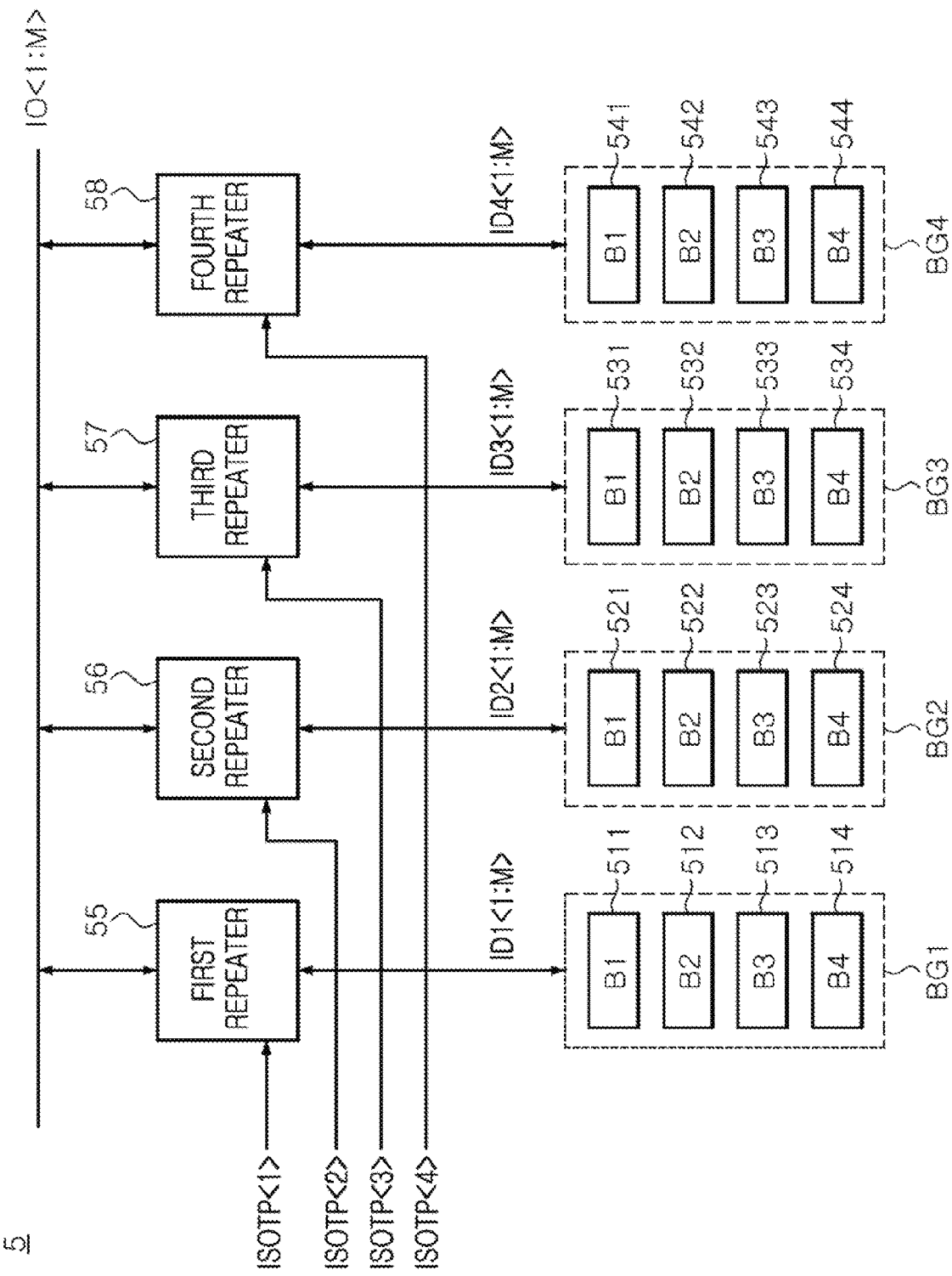
FIG. 10 is a block diagram illustrating a configuration of a core region included in the semiconductor device of FIG. 1.

Referring to FIG. 10, the core region 5 may include the first bank group BG1, the second bank group BG2, the third bank group BG3, the fourth bank group BG4, a first repeater 55, a second repeater 56, a third repeater 57, and a fourth repeater 58. The first bank group BG1 may include first to fourth banks 511~514. The second bank group BG2 may include first to fourth banks 521~524. The third bank group BG3 may include first to fourth banks 531~534. The fourth bank group BG4 may include first to fourth banks 541~544. The first repeater 55 may amplify first internal data ID1<1:M> outputted from the first to fourth banks 511~514 included in the first bank group BG1 by the first I/O control signal IOSTP<1> generated during the read operation to output the amplified data of the first internal data ID1<1:M> through I/O line IO<1:M>. The first repeater 55 may amplify data inputted through the I/O line IO<1:M> by the first I/O control signal IOSTP<1> generated during the write operation to generate the first internal data ID1<1:M> to be stored into the first to fourth banks 511~514 included in the first bank group BG1. The second repeater 56 may amplify second internal data ID2<1:M> outputted from the first to fourth banks 521~524 included in the second bank group BG2 by the second I/O control signal IOSTP<2> generated during the read operation to output the amplified data of the second internal data ID2<1:M> through the I/O line IO<1:M>. The second repeater 56 may amplify data inputted through the I/O line IO<1:M> by the second I/O control signal IOSTP<2> generated during the write operation to generate the second internal data ID2<1:M> to be stored into the first to fourth banks 521~524 included in the second bank group BG2. The third repeater 57 may amplify third internal data ID3<1:M> outputted from the first to fourth banks 531~534 included in the third bank group BG3 by the third I/O control signal IOSTP<3> generated during the read operation to output the amplified data of the third internal data ID3<1:M> through the I/O line IO<1:M>. The third repeater 57 may amplify data inputted through the I/O line IO<1:M> by the third I/O control signal IOSTP<3> generated during the write operation to generate the third internal data ID3<1:M> to be stored into the first to fourth banks 531~534 included in the third bank group BG3. The fourth repeater 58 may amplify fourth internal data ID4<1:M> outputted from the first to fourth banks 541~544 included in the fourth bank group BG4 by the fourth I/O control signal IOSTP<4> generated during the read operation to output the amplified data of the fourth internal data ID4<1:M> through the I/O line IO<1:M>. The fourth repeater 58 may amplify data inputted through the I/O line IO<1:M> by the fourth I/O control signal IOSTP<4> generated during the write operation to generate the fourth internal data ID4<1:M> to be stored into the first to fourth banks 541~544 included in the fourth bank group BG4.

The read operation and the write operation of the core region 5, which are performed in the 8 bank mode, will be described hereinafter.

In the 8 bank mode, after the first and third repeater 55 and 57 included in the core region 5 are driven to perform the read operation or the write operation of the first and third bank groups BG1 and BG3, the second and fourth repeater 56 and 58 included in the core region 5 may be driven to perform the read operation or the write operation of the second and fourth bank groups BG2 and BG4. In the 8 bank mode, a sequence that the first to fourth repeaters 55~58 are driven may be set to be different according to the embodiments.

Figure 11:
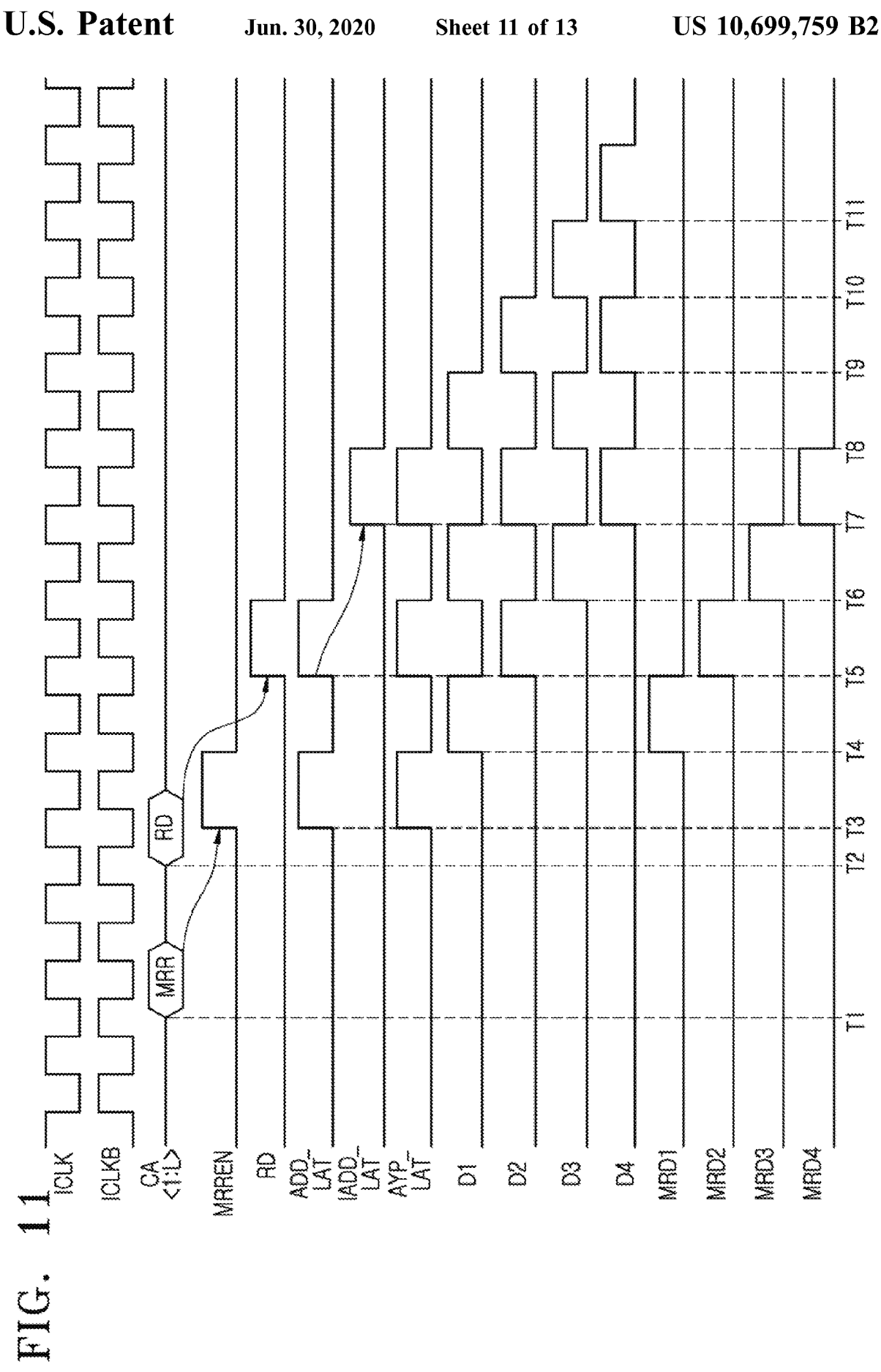
FIGS. 11 and 12 are timing diagrams illustrating an operation of a semiconductor device according to an embodiment of the present disclosure.
Figure 12:
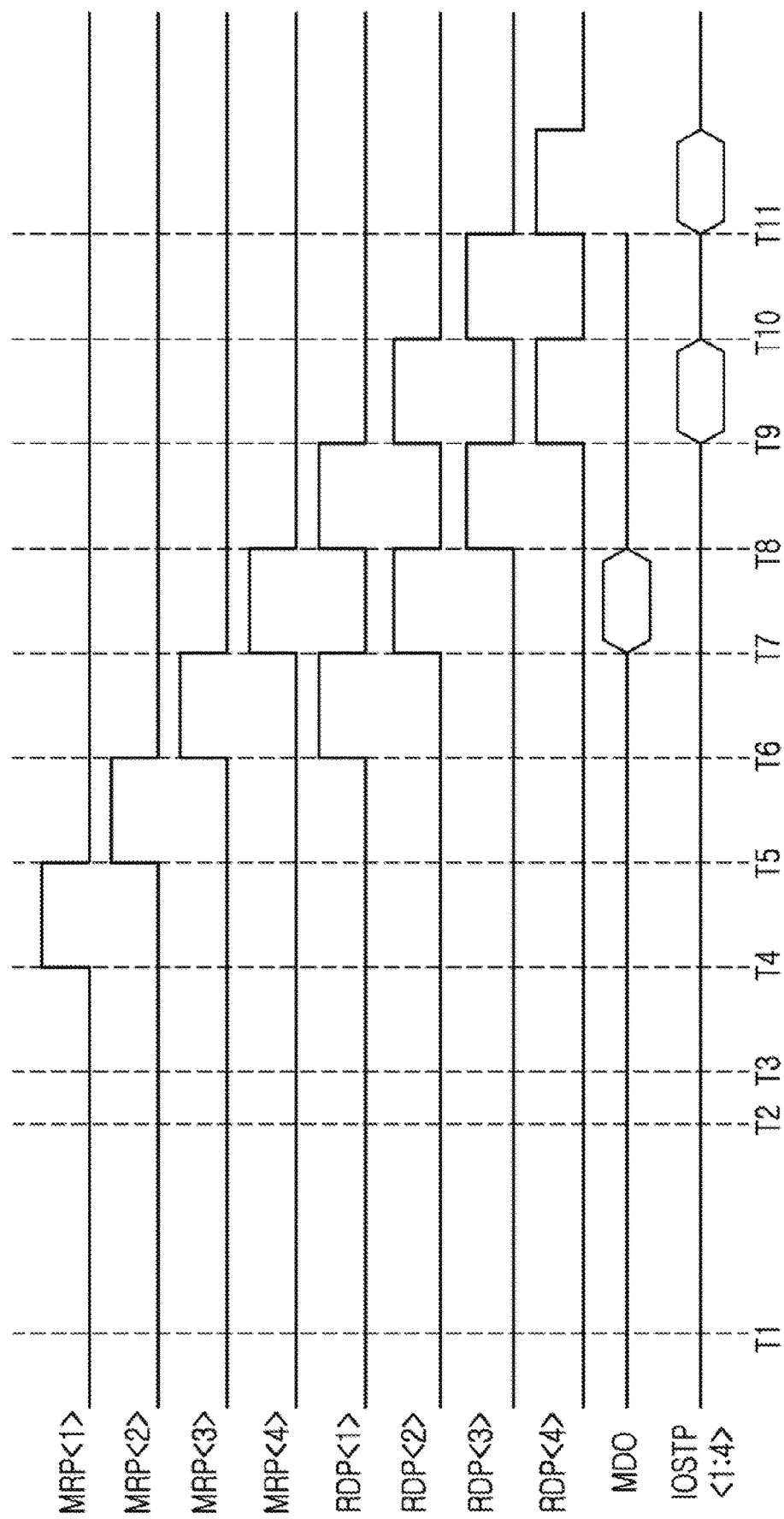

The mode register read operation and the read operation of the semiconductor device successively performed according to an embodiment will be described hereinafter with reference to FIGS. 11 and 12.

At a point in time "T1", the command/address signal CA<1:L> having a logic level combination for the mode register read operation 'MRR' may be inputted to the semiconductor device.

At a point in time "T2", the command/address signal CA<1:L> having a logic level combination for the read operation 'RD' may be inputted to the semiconductor device.

At a point in time "T3", the command decoder 11 of the column pulse generation circuit 1 may be synchronized with the internal clock signal ICLK and the inverted internal clock signal ICLKB to generate the mode register enablement signal MRREN having a logic "high" level based on the command/address signal CA<1:L> inputted at the point in time "T1".

The pulse generation circuit 12 of the column pulse generation circuit 1 may generate the column control pulse ADD_LAT including a pulse having a logic "high" level based on the mode register enablement signal MRREN having a logic "high" level.

The column signal generation circuit 21 of the delay circuit 2 may generate the column signal AYP_LAT having a logic "high" level from the column control pulse ADD_LAT based on the mode register enablement signal MRREN having a logic "high" level.

At a point in time "T4", the internal delay circuit 22 of the delay circuit 2 may delay the column signal AYP_LAT generated at the point in time "T3" to generate the first delay signal D1 which is enabled to have a logic "high" level.

The timing control circuit 23 of the delay circuit 2 may delay the mode register enablement signal MRREN generated at the point in time "T3" in synchronization with the first delay signal D1 to generate the first register delay signal MRD1 having a logic "high" level.

The control signal generation circuit 24 of the delay circuit 2 may generate the first register control signal MRP<1> having a logic "high" level from the first delay signal D1 based on the first register delay signal MRD1 having a logic "high" level.

The internal mode information signal generation circuit 41 of the register control circuit 4 may delay the mode information signal MDI in synchronization with the first register control signal MRP<1> to generate the first transmission mode information signal TMI<1>.

At a point in time "T5", the command decoder 11 of the column pulse generation circuit 1 may be synchronized with the internal clock signal ICLK and the inverted internal clock signal ICLKB to generate the read signal RD having a logic "high" level based on the command/address signal CA<1:L> inputted at the point in time "T2".

The pulse generation circuit 12 of the column pulse generation circuit 1 may generate the column control pulse ADD_LAT including a pulse having a logic "high" level based on the read signal RD having a logic "high" level.

The column signal generation circuit 21 of the delay circuit 2 may generate the column signal AYP_LAT having a logic "high" level from the column control pulse ADD_LAT based on the operation mode signal 8BKM having a logic "high" level.

The internal delay circuit 22 of the delay circuit 2 may delay the first delay signal D1 generated at the point in time "T4" to generate the second delay signal D2 which is enabled to have a logic "high" level.

The timing control circuit 23 of the delay circuit 2 may delay the first register delay signal MRD1 generated at the point in time "T4" in synchronization with the second delay signal D2 to generate the second register delay signal MRD2 having a logic "high" level.

The control signal generation circuit 24 of the delay circuit 2 may generate the second register control signal MRP<2> having a logic "high" level from the second delay signal D2 based on the second register delay signal MRD2 having a logic "high" level.

The address input circuit 31 of the read control circuit 3 may receive the first and second bank address signals BA<1:2> based on the column control pulse ADD_LAT having a logic "high" level to generate the first and second input bank address signals BAD<1:2>.

The internal mode information signal generation circuit 41 of the register control circuit 4 may delay the first transmission mode information signal TMI<1> generated at the point in time "T4" in synchronization with the second register control signal MRP<2> to generate the second transmission mode information signal TMI<2>.

At a point in time "T6", the internal delay circuit 22 of the delay circuit 2 may delay the second delay signal D1 generated at the point in time "T5" to generate the third delay signal D3 which is enabled to have a logic "high" level.

The timing control circuit 23 of the delay circuit 2 may delay the second register delay signal MRD2 generated at the point in time "T5" in synchronization with the third delay signal D3 to generate the third register delay signal MRD3 having a logic "high" level.

The control signal generation circuit 24 of the delay circuit 2 may generate the third register control signal MRP<3> having a logic "high" level from the third delay signal D3 based on the third register delay signal MRD3 having a logic "high" level.

The internal mode information signal generation circuit 41 of the register control circuit 4 may delay the second transmission mode information signal TMI<2> generated at the point in time "T5" in synchronization with the third register control signal MRP<3> to generate the internal mode information signal IMD.

The internal delay circuit 22 of the delay circuit 2 may delay the column control pulse ADD_LAT generated at the point in time "T5" to generate the first delay signal D1 which is enabled to have a logic "high" level.

The control signal generation circuit 24 of the delay circuit 2 may generate the first read control signal RDP<1> having a logic "high" level from the first delay signal D1 based on the first register delay signal MRD1 having a logic "low" level.

The internal address generation circuit 32 of the read control circuit 3 may be synchronized with the first read control signal RDP<1> to generate the first transmission address signal TA<1> by delaying the first input bank address signal BAD<1> generated at the point in time "T5" and to generate the third transmission address signal TA<3> by delaying the second input bank address signal BAD<2> generated at the point in time "T5".

At a point in time "T7", the internal delay circuit 22 of the delay circuit 2 may delay the third delay signal D3 generated at the point in time "T6" to generate the fourth delay signal D4 which is enabled to have a logic "high" level.

The timing control circuit 23 of the delay circuit 2 may delay the third register delay signal MRD3 generated at the point in time "T6" in synchronization with the fourth delay signal D4 to generate the fourth register delay signal MRD4 having a logic "high" level.

The control signal generation circuit 24 of the delay circuit 2 may generate the fourth register control signal MRP<4> having a logic "high" level from the fourth delay signal D4 based on the fourth register delay signal MRD4 having a logic "high" level.

The output circuit 42 of the register control circuit 4 may be synchronized with the fourth register control signal MRP<4> to output the internal mode information signal IMD as the mode output information signal MDO.

The pulse generation circuit 12 of the column pulse generation circuit 1 may shift the column control pulse ADD_LAT generated at the point in time "T5" by a predetermined period to generate the internal column control pulse IADD_LAT having a logic "high" level.

The column signal generation circuit 21 of the delay circuit 2 may generate the column signal AYP_LAT having a logic "high" level from the internal column control pulse IADD_LAT based on the operation mode signal 8BKM having a logic "high" level.

The internal delay circuit 22 of the delay circuit 2 may delay the first delay signal D1 generated at the point in time "T6" to generate the second delay signal D2 which is enabled to have a logic "high" level.

The control signal generation circuit 24 of the delay circuit 2 may generate the second read control signal RDP<2> having a logic "high" level from the second delay signal D2 based on the second register delay signal MRD2 having a logic "low" level.

The address input circuit 31 of the read control circuit 3 may receive the first and second bank address signals BA<1:2> based on the internal column control pulse IADD_LAT having a logic "high" level to generate the first and second input bank address signals BAD<1:2>.

The internal address generation circuit 32 of the read control circuit 3 may be synchronized with the second read control signal RDP<2> to generate the second transmission address signal TA<2> by delaying the first transmission address signal TA<1> generated at the point in time "T6" and to generate the fourth transmission address signal TA<4> by delaying the third transmission address signal TA<3> generated at the point in time "T6".

At a point in time "T8", the internal delay circuit 22 of the delay circuit 2 may delay the second delay signal D2 generated at the point in time "T7" to generate the third delay signal D3 which is enabled to have a logic "high" level.

The control signal generation circuit 24 of the delay circuit 2 may generate the third read control signal RDP<3> having a logic "high" level from the third delay signal D3 based on the third register delay signal MRD3 having a logic "low" level.

The internal address generation circuit 32 of the read control circuit 3 may be synchronized with the third read control signal RDP<3> to generate the first internal address signal IAD<1> by delaying the second transmission address signal TA<2> generated at the point in time "T7" and to generate the second internal address signal IAD<2> by delaying the fourth transmission address signal TA<4> generated at the point in time "T7".

The internal delay circuit 22 of the delay circuit 2 may delay the internal column control pulse IADD_LAT generated at the point in time "T7" to generate the first delay signal D1 which is enabled to have a logic "high" level.

The control signal generation circuit 24 of the delay circuit 2 may generate the first read control signal RDP<1> having a logic "high" level from the first delay signal D1 based on the first register delay signal MRD1 having a logic "low" level.

The internal address generation circuit 32 of the read control circuit 3 may be synchronized with the first read control signal RDP<1> to generate the first transmission address signal TA<1> by delaying the first input bank address signal BAD<1> generated at the point in time "T7" and to generate the third transmission address signal TA<3> by delaying the second input bank address signal BAD<2> generated at the point in time "T7".

At a point in time "T9", the internal delay circuit 22 of the delay circuit 2 may delay the third delay signal D3 generated at the point in time "T8" to generate the fourth delay signal D4 which is enabled to have a logic "high" level.

The control signal generation circuit 24 of the delay circuit 2 may generate the fourth read control signal RDP<4> having a logic "high" level from the fourth delay signal D4 based on the fourth register delay signal MRD4 having a logic "low" level.

The I/O control signal generation circuit 33 of the read control circuit 3 may be synchronized with the fourth read control signal RDP<4> to generate the first to fourth I/O control signals IOSTP<1:4> from the first and second internal address signals IAD<1:2>. In such a case, the first I/O control signal IOSTP<1> may be enabled.

The core region 5 may perform the read operation in any one among the first to fourth bank groups BG1, BG2, BG3, and BG4, which is activated according to the first to fourth I/O control signals IOSTP<1:4>. In such a case, the first bank group BG1 may be activated to perform the read operation.

The internal delay circuit 22 of the delay circuit 2 may delay the first delay signal D1 generated at the point in time "T8" to generate the second delay signal D2 which is enabled to have a logic "high" level.

The control signal generation circuit 24 of the delay circuit 2 may generate the second read control signal RDP<2> having a logic "high" level from the second delay signal D2 based on the second register delay signal MRD2 having a logic "low" level.

The internal address generation circuit 32 of the read control circuit 3 may be synchronized with the second read control signal RDP<2> to generate the second transmission address signal TA<2> by delaying the first transmission address signal TA<1> generated at the point in time "T8" and to generate the fourth transmission address signal TA<4> by delaying the third transmission address signal TA<3> generated at the point in time "T8".

At a point in time "T10", the internal delay circuit 22 of the delay circuit 2 may delay the second delay signal D2 generated at the point in time "T9" to generate the third delay signal D3 which is enabled to have a logic "high" level.

The control signal generation circuit 24 of the delay circuit 2 may generate the third read control signal RDP<3> having a logic "high" level from the third delay signal D3 based on the third register delay signal MRD3 having a logic "low" level.

The internal address generation circuit 32 of the read control circuit 3 may be synchronized with the third read control signal RDP<3> to generate the first internal address signal IAD<1> by delaying the second transmission address signal TA<2> generated at the point in time "T9" and to generate the second internal address signal IAD<2> by delaying the fourth transmission address signal TA<4> generated at the point in time "T9".

At a point in time "T11", the internal delay circuit 22 of the delay circuit 2 may delay the third delay signal D3 generated at the point in time "T10" to generate the fourth delay signal D4 which is enabled to have a logic "high" level.

The control signal generation circuit 24 of the delay circuit 2 may generate the fourth read control signal RDP<4> having a logic "high" level from the fourth delay signal D4 based on the third register delay signal MRD3 having a logic "low" level.

The I/O control signal generation circuit 33 of the read control circuit 3 may be synchronized with the fourth read control signal RDP<4> to generate the first to fourth I/O control signals IOSTP<1:4> from the first and second internal address signals IAD<1:2>. In such a case, the third I/O control signal IOSTP<3> may be enabled.

The core region 5 may perform the read operation in any one among the first to fourth bank groups BG1, BG2, BG3, and BG4, which is activated according to the first to fourth I/O control signals IOSTP<1:4>. In such a case, the third bank group BG3 may be activated to perform the read operation.

As described above, a semiconductor device according to an embodiment may include a single delay circuit generating both a control signal for performing a read operation and a control signal for performing a mode register read operation, thereby reducing a layout area of the semiconductor device as well as reducing power consumption of the semiconductor device.

Figure 13:
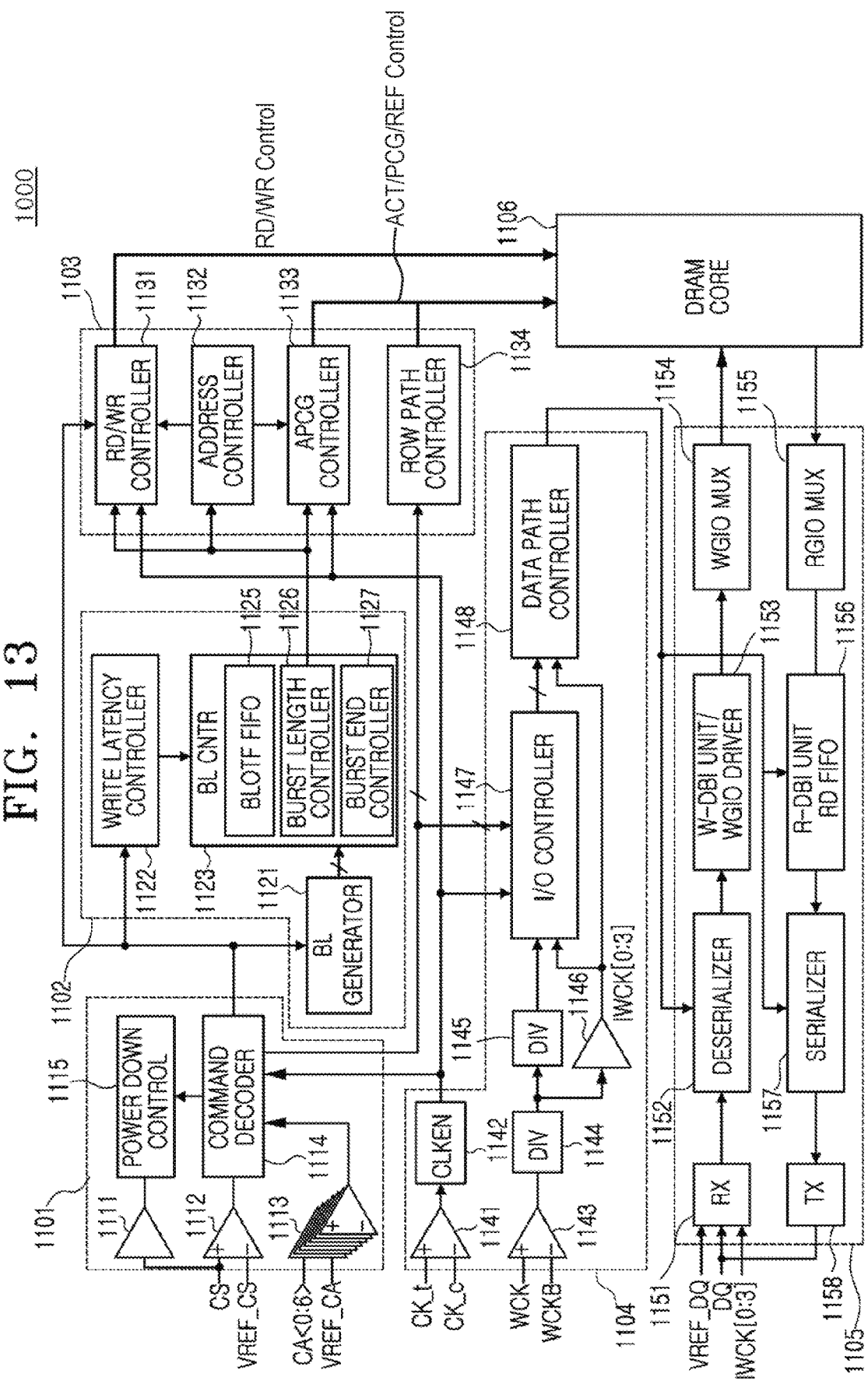
FIG. 13 is a block diagram illustrating a configuration of a semiconductor device according to an embodiment of the present disclosure.

Referring to FIG. 13, a semiconductor device 1000 according to an embodiment may include a command control circuit 1101, a latency/burst control circuit 1102, an operation control circuit 1103, an input/output (I/O) control circuit 1104, a data I/O circuit 1105 and a DRAM core 1106.

The command control circuit 1101 may include an input drive circuit 1111, a chip selection signal buffer 1112, a command/address buffer 1113, a command decoder 1114 and a power-down control circuit 1115. The input drive circuit 1111 may receive and drive a chip selection signal CS to transmit the chip selection signal CS to the power-down control circuit 1115. The chip selection signal buffer 1112 may buffer and receive the chip selection signal CS based on a chip selection reference voltage VREF_CS. The command/address buffer 1113 may buffer and receive a command/address signal CA<0:6> based on a command/address reference voltage VREF_CA. The command decoder 1114 may decode the command/address signal CA<0:6> buffered by the command/address buffer 1113 based on the chip selection signal CS buffered by the chip selection signal buffer 1112 to generate various commands for the operation of the semiconductor device 1000. The power-down control circuit 1115 may control a power-down mode based on the chip selection signal CS driven by the input drive circuit 1111 and a command generated by the command decoder 1114.

The latency/burst control circuit 1102 may include a burst length information generator 1121, a write latency controller 1122 and a burst length control circuit 1123. The burst length information generator 1121 may generate information for control of a burst length operation based on a command generated by the command decoder 1114. The write latency controller 1122 may perform a control operation according to a write latency based on a command transmitted through the command decoder 1114. The burst length control circuit 1123 may include an information storage circuit 1125 storing information outputted from the burst length information generator 1121. The burst length control circuit 1123 may include a burst length controller 1126 for controlling the burst length operation based on a command transmitted through the command decoder 1114, a signal outputted from the write latency controller 1122, and information outputted from the burst length information generator 1121. The burst length control circuit 1123 may include a burst end controller 1127 for controlling a burst end operation based on a command transmitted through the command decoder 1114, a signal outputted from the write latency controller 1122, and information outputted from the burst length information generator 1121.

The operation control circuit 1103 may include a read/write controller 1131, an address controller 1132, an auto-pre-charge controller 1133 and a row path controller 1134 to generate a read/write control signal RD/WR_Control for controlling a read operation and a write operation as well as a row path control signal ACT/PCG/REF_Control for controlling an active operation, a pre-charge operation and a refresh operation. The read/write controller 1131 may control the read operation and the write operation based on a signal outputted from the latency/burst control circuit 1102 and a signal outputted from the address controller 1132 if clock signals CK_t and CK_c are activated. The address controller 1132 may control generation of an address based on a signal outputted from the latency/burst control circuit 1102. The auto-pre-charge controller 1133 may control an auto-pre-charge operation based on a signal outputted from the latency/burst control circuit 1102 if the clock signals CK_t and CK_c are activated. The row path controller 1134 may control a row path based on a command transmitted through the command decoder 1114.

The I/O control circuit 1104 may include a first clock buffer 1141, a clock enablement signal generator 1142, a second clock buffer 1143, a first divider 1144, a second divider 1145, an internal clock driver 1146, an I/O controller 1147 and a data path controller 1148. The first clock buffer 1141 may receive and buffer the clock signals CK_t and CK_c. The clock enablement signal generator 1142 may generate a clock enablement signal after the clock signals CK_t and CK_c buffered by the first clock buffer 241 are activated. The second clock buffer 1143 may receive and buffer data clock signals WCK and WCKB for input and output of the data. The first divider 1144 may divide the data clock signals WCK and WCKB buffered by the second clock buffer 1143. The second divider 1145 may receive and divide an output signal of the first divider 1144. The internal clock driver 1146 may receive and divide an output signal of the first divider 1144 to generate an internal data clock signal IWCK[0:3]. The I/O controller 1147 may receive a signal divided by the second divider 1145 and the internal data clock signal IWCK[0:3] generated by the internal clock driver 1146 to control the input and output of the data. The data path controller 1148 may control a data path used in the input and output of the data, based on a signal outputted from the I/O controller 1147 and the internal data clock signal IWCK[0:3] generated by the internal clock driver 1146.

The data I/O circuit 1105 may include a receiver 1151, a deserializer 1152, a write driver 1153, a write multiplexer 1154, a read multiplexer 1155, a read driver 1156, a serializer 1157 and a transmitter 1158. The receiver 1151 may be synchronized with the internal data clock signal IWCK[0:3] to receive transmission data DQ based on a data reference voltage VREF_DQ. The deserializer 1152 may convert the transmission data DQ inputted in series through the receiver 1151 into parallel data. The write driver 1153 may drive the parallel data to transmit the driven parallel data to the write multiplexer 1154. The write multiplexer 1154 may transmit the data driven by the write driver 1153 to the DRAM core 1106 using a multiplexing technique with an I/O line. The read multiplexer 1155 may output the data outputted from the DRAM core 1106 through the I/O line to the read driver 1156 using a multiplexing technique during the read operation. The read driver 1156 may drive the data outputted from the DRAM core 1106 through the read multiplexer 1155 to output the driven data to the serializer 1157. The serializer 1157 may convert the data outputted from the read driver 1156 into serial data. The transmitter 1158 may output the serial data converted by the serializer 1157 as the transmission data DQ.

The DRAM core 1106 may perform the read operation or the write operation for outputting or receiving the data through the data I/O circuit 1105 based on the read/write control signal RD/WR_Control. The DRAM core 1106 may perform the active operation, the pre-charge operation, or the refresh operation based on the row path control signal ACT/PCG/REF_Control.

The operation control circuit 1103 may correspond to a circuit including the column pulse generation circuits 1, the delay circuits 2, the read control circuits 3, the register control circuits 4 and the core regions 5 which are illustrated in FIG. 1, and the DRAM core 1106 may correspond to the core regions 5 illustrated in FIG. 1.

What is claimed is:

1. A semiconductor device comprising:
a delay circuit configured to generate a read control signal by delaying a column control pulse and an internal column control pulse including pulses sequentially generated based on an operation mode signal during a read operation and configured to generate a register control signal by delaying the column control pulse including a pulse generated based on a mode register enablement signal during a mode register read operation;
a read control circuit configured to generate an input/output (I/O) control signal from a bank address signal when the read control signal is enabled; and
a register control circuit configured to output a mode information signal as a mode output information signal when the register control signal is enabled.

2. The semiconductor device of claim 1, wherein a delay time by which the column control pulse and the internal column control pulse are delayed to generate the read control signal is set to be equal to a delay time by which the column control pulse is delayed to generate the register control signal.

3. The semiconductor device of claim 1, wherein the operation mode signal is provided by an external device to enter an 8 bank mode for performing the read operation of two bank groups among a plurality of bank groups included in a core region.

4. The semiconductor device of claim 1, wherein the mode register enablement signal is generated from a command/address signal which is inputted to perform the mode register read operation.

5. The semiconductor device of claim 1,
wherein the read control signal comprises first to fourth read control signals;
wherein the register control signal comprises first to fourth register control signals; and
wherein the delay circuit comprises:
a column signal generation circuit configured to generate a column signal based on the column control pulse and the internal column control pulse when any one of the operation mode signal and the mode register enablement signal is enabled;
an internal delay circuit configured to delay the column signal to generate first to fourth delay signals which are sequentially enabled;
a timing control circuit configured to delay the mode register enablement signal based on the first to fourth delay signals to generate first to fourth register delay signals which are sequentially enabled; and
a control signal generation circuit configured to generate the first to fourth read control signals from the first to fourth delay signals based on logic levels of the first to fourth register delay signals and configured to generate the first to fourth register control signals from the first to fourth delay signals based on logic levels of the first to fourth register delay signals.

6. The semiconductor device of claim 5, wherein the column signal generation circuit comprises:
a first logic circuit configured to generate a transmission control signal which is enabled when any one of the operation mode signal and the mode register enablement signal is enabled;
a second logic circuit configured to generate a pre-column signal which is enabled when any one of the column control pulse and the internal column control pulse is enabled; and
a third logic circuit configured to buffer the pre-column signal to generate the column signal when the transmission control signal is enabled.

7. The semiconductor device of claim 5, wherein the internal delay circuit comprises:
a first unit delay circuit configured to delay the column signal to generate the first delay signal;
a second unit delay circuit configured to delay the first delay signal to generate the second delay signal;
a third unit delay circuit configured to delay the second delay signal to generate the third delay signal; and
a fourth unit delay circuit configured to delay the third delay signal to generate the fourth delay signal.

8. The semiconductor device of claim 5, wherein the timing control circuit comprises:
a first latch circuit configured to latch the mode register enablement signal in synchronization with the first delay signal to generate a first register delay signal;
a second latch circuit configured to latch the first register delay signal in synchronization with the second delay signal to generate a second register delay signal;
a third latch circuit configured to latch the second register delay signal in synchronization with the third delay signal to generate a third register delay signal; and
a fourth latch circuit configured to latch the third register delay signal in synchronization with the fourth delay signal to generate a fourth register delay signal.

9. The semiconductor device of claim 5, wherein the control signal generation circuit comprises:
a first control signal generation circuit configured to buffer the first delay signal to generate the first read control signal when a first register delay signal is disabled and configured to buffer the first delay signal to generate the first register control signal when the first register delay signal is enabled;
a second control signal generation circuit configured to buffer the second delay signal to generate the second read control signal when a second register delay signal is disabled and configured to buffer the second delay signal to generate the second register control signal when the second register delay signal is enabled;
a third control signal generation circuit configured to buffer the third delay signal to generate the third read control signal when a third register delay signal is disabled and configured to buffer the third delay signal to generate the third register control signal when the third register delay signal is enabled; and
a fourth control signal generation circuit configured to buffer the fourth delay signal to generate the fourth read control signal when a fourth register delay signal is disabled and configured to buffer the fourth delay signal to generate the fourth register control signal when the fourth register delay signal is enabled.

10. The semiconductor device of claim 1,
wherein the read control signal comprises first to fourth read control signals; and
wherein the read control circuit comprises:
an address input circuit configured to receive first and second bank address signals to generate first and second input bank address signals when at least one of the column control pulse and the internal column control pulse is enabled;
an internal address generation circuit configured to delay the first and second input bank address signals in synchronization with the first to third read control signals to generate first and second internal address signals; and
an I/O control signal generation circuit configured to be synchronized with the fourth read control signal to generate first to fourth I/O control signals from the first and second internal address signals.

11. A semiconductor device comprising:
a delay circuit configured to generate first to fourth read control signals by delaying a column control pulse and an internal column control pulse during a read operation and configured to generate first to fourth register control signals by delaying the column control pulse during a mode register read operation;
a read control circuit configured to be synchronized with the first to fourth read control signals to generate first to fourth input/output (I/O) control signals from first and second bank address signals; and
a register control circuit configured to be synchronized with the first to fourth register control signals to output a mode information signal as a mode output information signal.

12. The semiconductor device of claim 11,
wherein each of the first to fourth read control signals comprises two pulses which are sequentially generated; and
wherein each of the first to fourth register control signals comprises a single pulse.

13. The semiconductor device of claim 11, wherein a delay time by which the column control pulse and the internal column control pulse are delayed to generate the first to fourth read control signals is set to be equal to a delay time by which the column control pulse is delayed to generate the first to fourth register control signals.

14. The semiconductor device of claim 11, wherein the delay circuit comprises:
a column signal generation circuit configured to generate a column signal based on the column control pulse and the internal column control pulse when any one of an operation mode signal and a mode register enablement signal is enabled;
an internal delay circuit configured to delay the column signal to generate first to fourth delay signals which are sequentially enabled;
a timing control circuit configured to delay the mode register enablement signal based on the first to fourth delay signals to generate first to fourth register delay signals which are sequentially enabled; and
a control signal generation circuit configured to generate the first to fourth read control signals from the first to fourth delay signals based on logic levels of the first to fourth register delay signals and configured to generate the first to fourth register control signals from the first to fourth delay signals based on logic levels of the first to fourth register delay signals.

15. The semiconductor device of claim 14, wherein the column signal generation circuit comprises:
a first logic circuit configured to generate a transmission control signal which is enabled when any one of the operation mode signal and the mode register enablement signal is enabled;
a second logic circuit configured to generate a pre-column signal which is enabled when any one of the column control pulse and the internal column control pulse is enabled; and
a third logic circuit configured to buffer the pre-column signal to generate the column signal when the transmission control signal is enabled.

16. The semiconductor device of claim 14, wherein the internal delay circuit comprises:
a first unit delay circuit configured to delay the column signal to generate the first delay signal;
a second unit delay circuit configured to delay the first delay signal to generate the second delay signal;
a third unit delay circuit configured to delay the second delay signal to generate the third delay signal; and
a fourth unit delay circuit configured to delay the third delay signal to generate the fourth delay signal.

17. The semiconductor device of claim 14, wherein the timing control circuit comprises:
a first latch circuit configured to latch the mode register enablement signal in synchronization with the first delay signal to generate a first register delay signal;
a second latch circuit configured to latch the first register delay signal in synchronization with the second delay signal to generate a second register delay signal;
a third latch circuit configured to latch the second register delay signal in synchronization with the third delay signal to generate a third register delay signal; and
a fourth latch circuit configured to latch the third register delay signal in synchronization with the fourth delay signal to generate a fourth register delay signal.

18. The semiconductor device of claim 14, wherein the control signal generation circuit comprises:
a first control signal generation circuit configured to buffer the first delay signal to generate the first read control signal when the first register delay signal is disabled and configured to buffer the first delay signal to generate the first register control signal when the first register delay signal is enabled;
a second control signal generation circuit configured to buffer the second delay signal to generate the second read control signal when the second register delay signal is disabled and configured to buffer the second delay signal to generate the second register control signal when the second register delay signal is enabled;
a third control signal generation circuit configured to buffer the third delay signal to generate the third read control signal when the third register delay signal is disabled and configured to buffer the third delay signal to generate the third register control signal when the third register delay signal is enabled; and
a fourth control signal generation circuit configured to buffer the fourth delay signal to generate the fourth read control signal when the fourth register delay signal is disabled and configured to buffer the fourth delay signal to generate the fourth register control signal when the fourth register delay signal is enabled.

19. The semiconductor device of claim 11,
wherein the read control circuit comprises:
an address input circuit configured to receive first and second bank address signals to generate first and second input bank address signals when at least one of the column control pulse and the internal column control pulse is enabled;
an internal address generation circuit configured to delay the first and second input bank address signals in synchronization with the first to third read control signals to generate first and second internal address signals; and
an I/O control signal generation circuit configured to be synchronized with the fourth read control signal to generate first to fourth I/O control signals from the first and second internal address signals.

20. The semiconductor device of claim 11, further comprising a core region including first to fourth bank groups which are selectively activated based on the first to fourth I/O control signals,
wherein two of the first to fourth bank groups are activated during the read operation.

* * * * *